United States Patent
Erhart et al.

(10) Patent No.: US 7,317,775 B1
(45) Date of Patent: Jan. 8, 2008

(54) SWITCHED DESKEW ON ARBITRARY DATA

(75) Inventors: Richard Alexander Erhart, Tempe, AZ (US); Loren Tomasi, Gilbert, AZ (US); Mark D. Kuhns, Peoria, AZ (US); Arif Alam, Chandler, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 735 days.

(21) Appl. No.: 10/892,760

(22) Filed: Jul. 16, 2004

(51) Int. Cl.
*H04L 7/00* (2006.01)

(52) U.S. Cl. ............... 375/355; 375/358; 375/360; 375/370; 375/376; 327/155; 327/156; 327/151; 327/158

(58) Field of Classification Search ............... 375/355, 375/360, 358, 359, 371, 376; 327/155, 156, 327/151, 160, 298, 144, 158, 161
See application file for complete search history.

(56) References Cited

U.S. PATENT DOCUMENTS

| | | | |
|---|---|---|---|
| 6,292,116 B1 * | 9/2001 | Wang et al. | 341/100 |
| 6,903,575 B1 * | 6/2005 | Davidson et al. | 326/47 |
| 7,164,742 B2 * | 1/2007 | McLeod | 375/355 |

OTHER PUBLICATIONS

Taylor, Ricky et al. 2003. National Semiconductor Advanced Information Spec. Preliminary 1.0. "High-Speed LVDS Receiver FPD00104 Product Development Specification." Revised Jun. 2, 2003. 28 pages.

* cited by examiner

*Primary Examiner*—David C. Payne
*Assistant Examiner*—Rahel Guarino
(74) *Attorney, Agent, or Firm*—Darby & Darby PC; John W. Branch

(57) ABSTRACT

A method and circuit capable of handling skew between a clock and data signal up to +/− one half bit on a random input data pattern. A digital algorithm cycles through each data bit and individually deskews that bit by detecting data transitions in a first sampling region and in a second sampling region and determining a difference between a number of transitions in the first sampling region and a number of transitions in the second sampling region. The sampling regions and a deskew timing signal may then be incremented or decremented based on a comparison of the computed difference to a predetermined constant. If no transitions occur on a particular bit, the algorithm times out leaving the deskew timing signal in the original position. When analysis of a final bit of a channel is completed, the algorithm begins monitoring and analyzing the first bit of another channel.

21 Claims, 6 Drawing Sheets

SWITCHED DESKEW ON ARBITRARY DATA

FIELD OF THE INVENTION

The present invention relates to signal processing, and in particular, to a method and circuit for performing deskew on arbitrary data.

BACKGROUND

Historically, design engineers implementing high-speed interfaces have met numerous challenges in maintaining interface signal timing relationships and signal quality. Issues such as skew, jitter, crosstalk, and noise have been addressed through a combination of analog circuitry and board/chip physical design rules. Generally, analog circuitry has been used for signal conditioning, filtering, impedance matching, and noise suppression, while physical design rules have targeted skew and crosstalk minimization.

Hybrid parallel-serial interfaces that leverage high-speed serial links have evolved out of the need to scale bus bandwidth, while containing interface electrical and physical design challenges. Commonly, the transition to serial and parallel-serial interfaces has been accompanied by an increase in design complexity caused by a loss of signal-to-signal timing relationships. Using hybrid parallel-serial interfaces may eliminate notions of setup, hold, and fixed skew times at the interface, rendering static timing at the interface relatively insignificant.

Various approaches have been tried for functional verification of uncertainty in edge placement, programmability of signal delay, and skew over a wide range of values, variable timing relationships between channels, and an ability to vary timing parameters across and outside of the valid range.

Thus, it is with respect to these considerations and others that the present invention has been made.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description of the Invention, which is to be read in association with the accompanying drawings, wherein.

DETAILED DESCRIPTION

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment or an embodiment combining software and hardware aspects. The following detailed description is, therefore, not to be taken in a limiting sense.

Briefly stated, the present invention is related to an algorithm that is capable of handling skew between a clock and data signal up to +/− one half bit in a random input data pattern by performing a statistical analysis on data transitions. Skew is a constant portion of a difference in arrival time between data of any two in-band signals. Most hybrid parallel-serial interfaces incorporate a deskewing logic circuit that realigns data transmitted over multiple serial lines. In one embodiment, the algorithm, which may be implemented in such a deskewing logic circuit, is arranged to cycle through each data bit and individually deskew that bit by selecting one of seven possible sampling strobe positions available for each bit. In another embodiment, the number of strobe positions may be selected differently. The algorithm may perform deskewing by detecting data transitions in a first sampling region and in a second sampling region and determining a difference between a number of transitions in the first sampling region and a number of transitions in the second sampling region. The selected strobe position, and thereby the sampling regions, may then be incremented or decremented to another strobe position based on a comparison of the computed difference to a predetermined transition hysteresis constant. If no transitions occur in a particular sampling region, the algorithm may time out leaving the strobe in the original position. When analysis of a final bit of a channel is completed, the algorithm may begin monitoring and analyzing a first bit of another channel.

While a preferred embodiment of the present invention may be implemented in a high-speed data receiver circuit, the invention is not so limited. The described circuit and method may be employed as part of virtually any digital communication circuit known to those skilled in the art.

Figure 1:
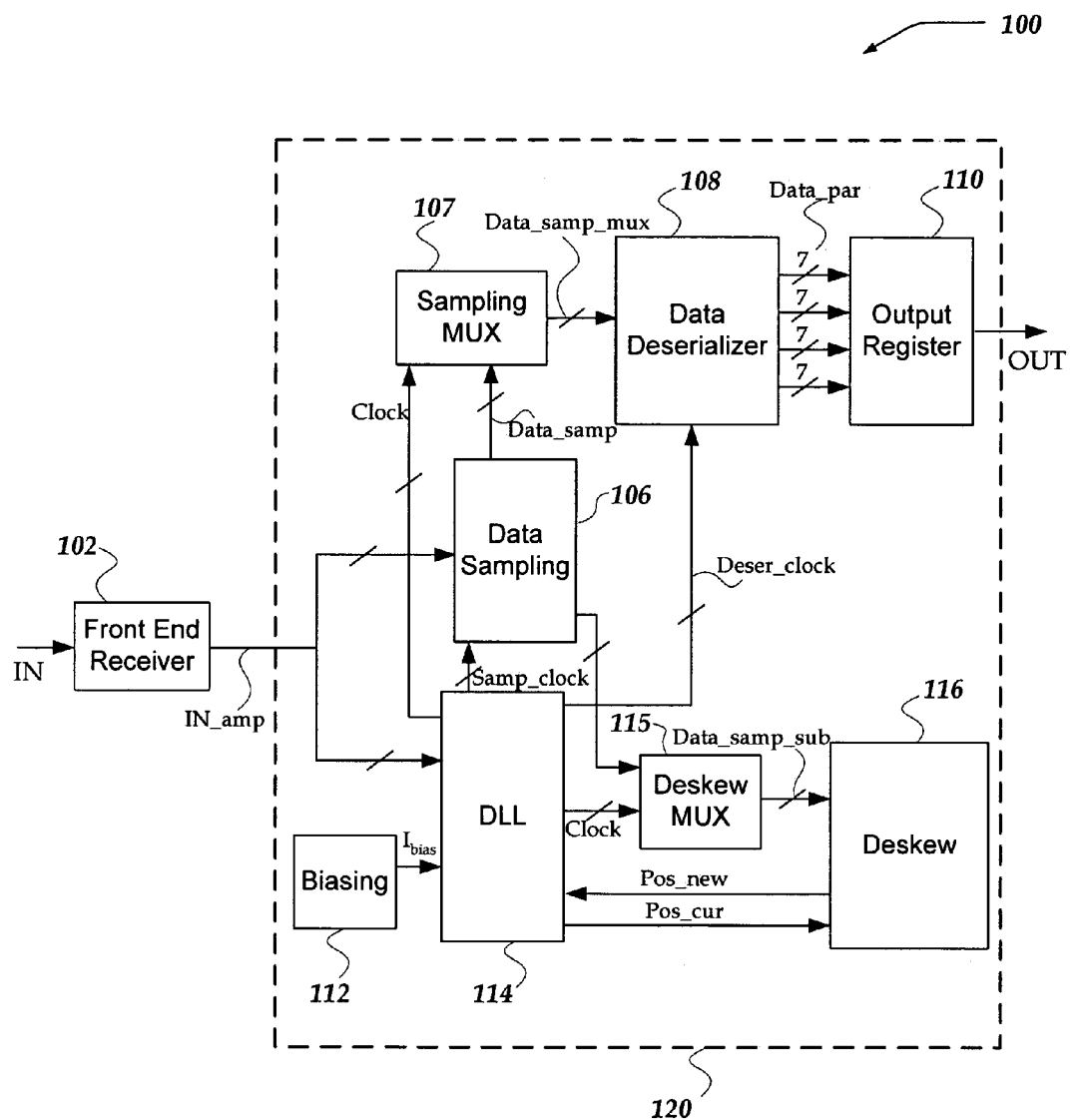
FIG. 1 illustrates a block diagram of a high-speed receiver circuit employing an embodiment of the deskew method according to the present invention.

FIG. 1 illustrates a block diagram of high-speed receiver circuit 100 employing an embodiment of a deskew method according to one aspect of the present invention. High-speed receiver circuit 100 includes front end receiver 102 and bit slice 120. Bit slice 120 is arranged to sample, deskew, and deserialize incoming data. Bit slice 120 includes data sampling circuit 106, sampling multiplexer 107, data deserializer 108, output register 110, biasing circuit 112, delay lock loop (DLL) 114, deskew multiplexer 115, and deskew logic circuit 116.

Front end receiver 102 is arranged to receive high-speed serial data signal IN and provide IN_amp to data sampling circuit 106 and delay lock loop (DLL) 114.

Data sampling circuit 106 is arranged to oversample each channel of the incoming serial data (IN_amp) by employing multiple sample clock signals Samp_clock from DLL 114 in order to provide multiple sample signals for each clock signal. The sampled data may be forwarded to data deserializer 108 through sampling multiplexer 107. In one embodiment, the number of strobe positions included in sample clock signal Samp_clock may be pre-selected to be equal to a number of bits for each channel that can be handled at the same time by the circuit, such as seven.

Sampling multiplexer 107 may receive sampled data Data_samp from data sampling circuit 106, select a portion of Data_samp based on Clock from DLL 114, and forward Data_samp_mux to data deserializer 108. A subset of the sampled data Data_samp_sub may also be forwarded through deskew multiplexer 115 to deskew block 116.

Data deserializer 108 is arranged to convert high-speed serial data from each channel to parallel output data operating at a lower clock speed. For example, in a circuit that is arranged to process four channels of 7-bit serial data, the output data may be 28-bit parallel data. Deserialization clock signal Deser_clock for a resampling of the data may be provided to data deserializer 108 from DLL 114, along with Data_samp_mux from sampling multiplexer 107 for deserialization process. This may allow DLL 114 to control sampling position of the data for deserialization and to deskew the data.

Output register 110 is arranged to receive the deserialized data Data_par and to provide it to other circuits as OUT. Output register 110 may be implemented as a series of buffers, flip-flops, and the like.

Biasing circuit 112 is arranged to provide biasing current $I_{bias}$ to front end receiver 102 (not shown) and DLL 114. In one embodiment, biasing circuit 112 may be implemented as a current source.

DLL 114 is arranged to lock on to an incoming timing signal (not shown) and to generate the strobe positions based on sampling clock Samp_clock and deserialization clock Deser_clock that are employed for sampling and resampling the data. A strobe position is determined when a sampling clock edge or level occurs. The sampling clock is a plurality of clock signals, where each clock signal after a first clock signal is shifted by a delay amount (delay tap) from a preceding clock signal. In one embodiment, a total of all sampling clock signals spans one bit wide. After the first plurality, the sampling clock signal begins again with the same delay taps. Deskew block 116 provides Deser_clock to data deserializer 108 for resampling the data.

Deskew block 116 is arranged to perform statistical analysis on Data_samp_sub and to provide new position instructions Pos_new to DLL 114 for modifying Deser_clock, which is provided to data deserializer 108 for deskewing the data. Deskew block 116 essentially implements a digital algorithm that analyzes the data one bit at a time. In one embodiment, the algorithm detects transitions in two adjacent sampling regions determined based on a selected strobe position and compares a difference between a number of detected transitions in a first sampling region and a number of detected transitions in a second sampling region to a predetermined transition hysteresis threshold constant. Based on a result of the comparison, the selected strobe position—and thereby the sample region—may then be incremented or decremented to the next strobe position. If the comparison determines the difference to be within a predetermined margin, the last strobe position is provided to DLL 114, which then updates Deser_clock to data deserializer 108 based on the last strobe position. The updating of Deser_clock enables deskewing of the data at the data deserializer 108.

FIG. 1 shows a particular arrangement of inputs and outputs of the various components. In one embodiment, all of the components of high-speed receiver circuit 100 may be included in the same chip. Alternatively, one or more of the components may be off-chip.

Figure 2:
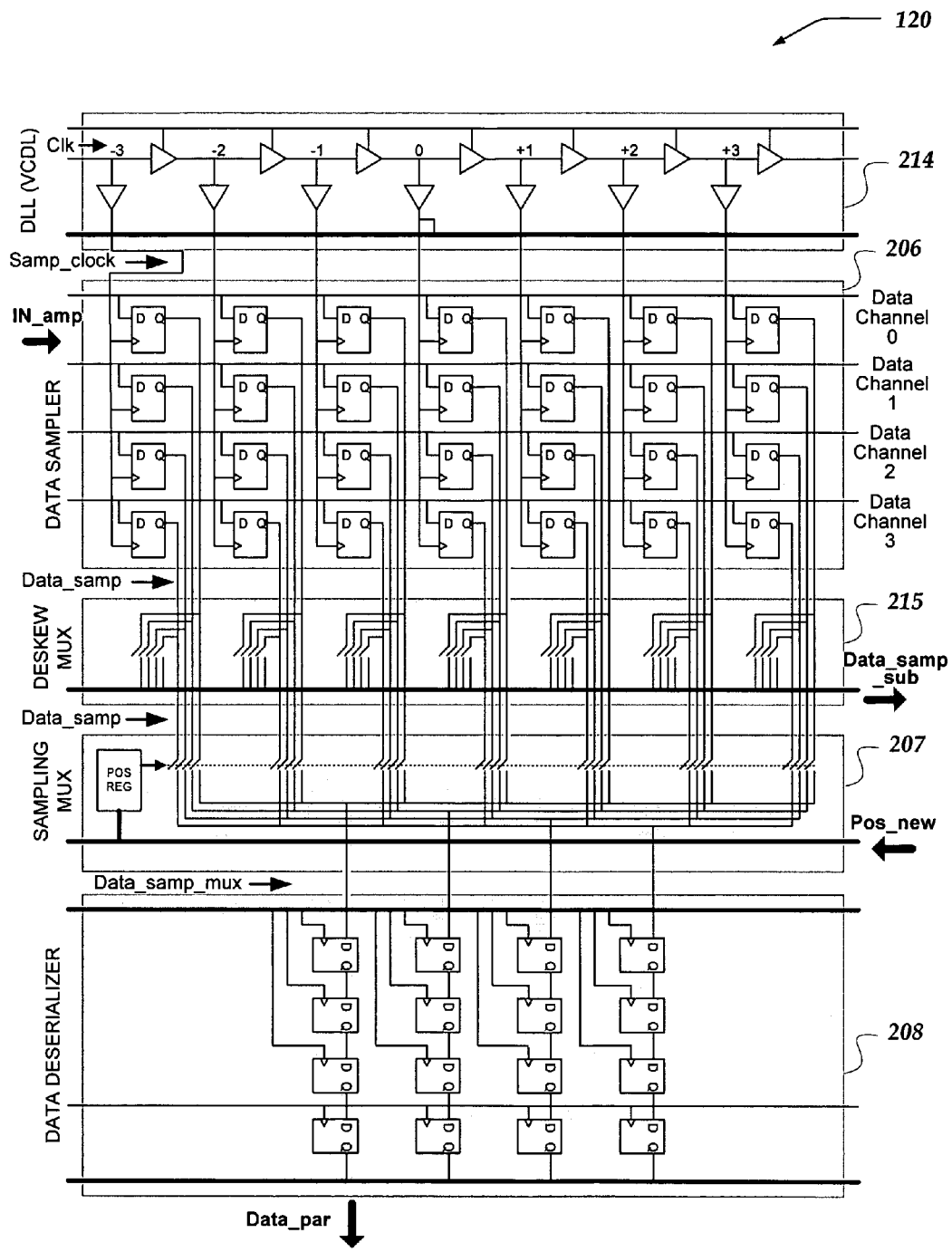
FIG. 2 schematically illustrates a simplified embodiment of the bit slice circuit of FIG. 1.

FIG. 2 schematically illustrates a simplified embodiment of bit slice 120 of FIG. 1. Bit slice 120 includes DLL (VCDL) 214, data sampler 206, deskew multiplexer 215, sampling multiplexer 207, data serializer 208.

Delay lock loop 114 of FIG. 1, which is arranged to lock on to an incoming timing signal and to generate the strobe positions that are employed for sampling the incoming data, may include a phase-frequency detector, a charge pump, a low pass filter and a voltage controlled delay line (VCDL). A simplified version of DLL (VCDL) 214 is shown in FIG. 2. A number of strobe positions may be determined based on a number of clock outputs provided by DLL (VCDL) 214. DLL (VCDL) 214 may receive an internal clock signal Clk and provide time delayed clock outputs Samp_clock to data sampler. In one embodiment, the number of clock outputs may be the same as the number of bits in the system (7 clocks for a 7-bit system). In another embodiment, a different number of clocks may be implemented that is not the same as the number of bits.

Data sampler 206 is arranged to oversample each channel of the incoming serial data IN_amp employing a predetermined number of strobe positions. Data sampler 206 may comprise sampling elements that are enabled by Samp_clock provided by DLL (VCDL) 214. A number of sampling elements may be determined by the number of strobe clocks provided by DLL (VCDL) 214 and by a number of channels that can be handled by the circuit. In one embodiment, the sampling elements may be flip-flops.

Deskew multiplexer 215 is arranged to provide a subset of the sampled data Data_samp_sub to deskew block. The subset may be determined by a channel selection provided by the deskew block, and the like.

Sampling multiplexer 207 is arranged to pass the sampled data to data deserializer 208. Sampling multiplexer 207 is further arranged to receive Pos_new from deskew block to provide a new sampling clock signal to data serializer. Sampling multiplexer 207 may include a plurality of flip-flops, registers, and a decoder.

Data deserializer 208 is arranged to convert high-speed serial data from each channel to parallel output data. Data deserializer 208 comprises a predetermined number of resampling stages. Each resampling stage includes resampling elements for each channel. In one embodiment, the resampling elements may be flip-flops. Each stage may allow the deskew algorithm to decrement or increment the strobe positions such that the last strobe position is substantially aligned with a transition density peak.

Figure 3:
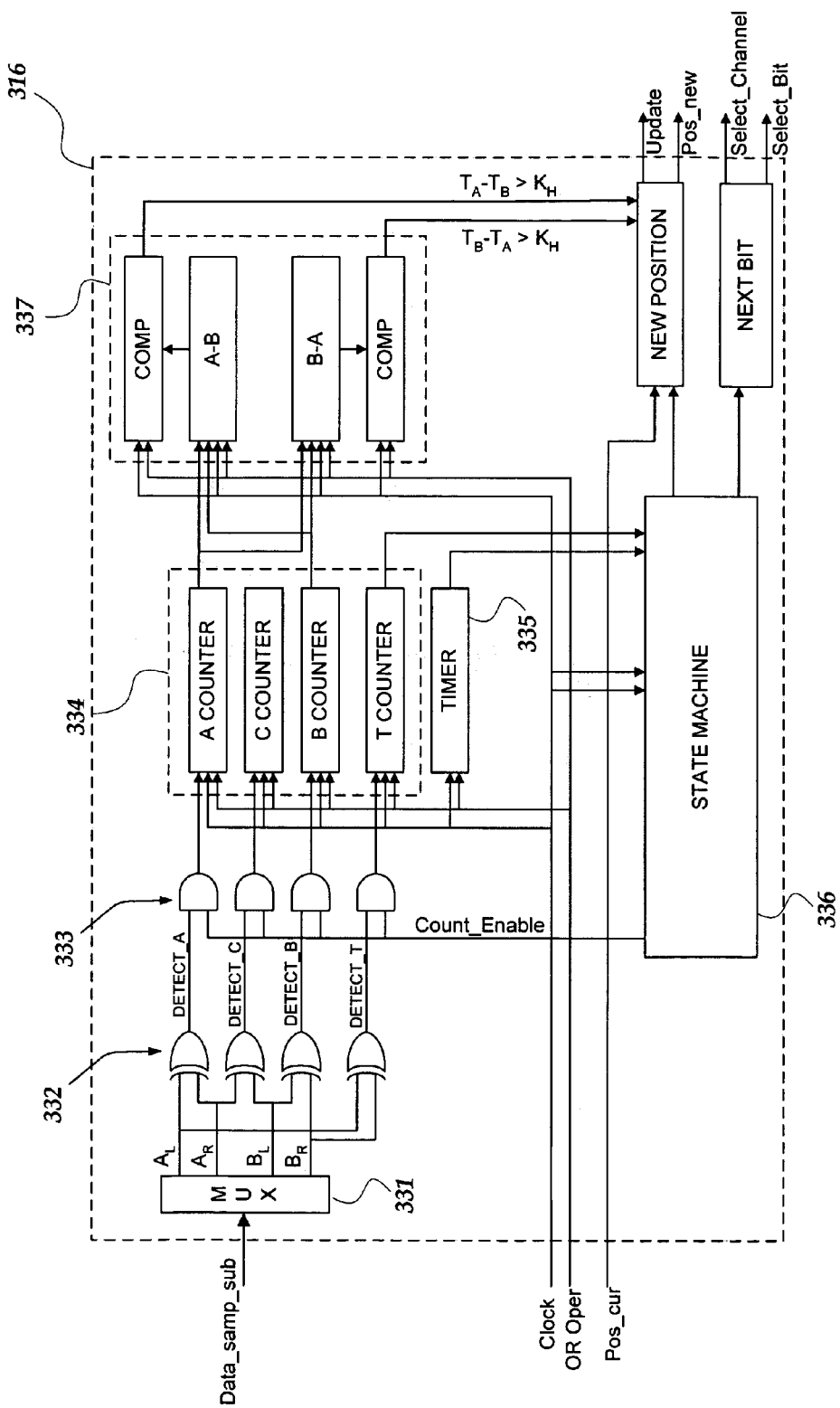
FIG. 3 illustrates a block diagram of an embodiment of a deskew algorithm that may be implemented in the circuit of FIG. 1.

FIG. 3 illustrates a block diagram of an embodiment of deskew block 316. Deskew block 316 includes multiplexing block 331, detection block 332, enabling block 333, counter block 334, timer 335, comparison block 337, and state machine 336.

In a typical operation, oversampled input data is provided to multiplexing block 331 and detection block 332 comprising OR-functions. Multiplexing block 331 and detection block 332 are arranged to detect transitions in sampling regions A and B. In one embodiment, sampling regions A and B may be three delay taps wide. In another embodiment, a width of the sampling regions may be selected differently. Detected transitions are subsequently provided to enabling block 333, which is arranged to control forwarding of the detected transitions to counter block 334. Enabling block 333 may comprise an AND-function for each detection line that forwards the signal based on a Count_enable signal from state machine 336.

Counter block 334 is arranged to count a number of transitions in each region in a predetermined interval. In one embodiment, the sampling regions may be positioned around a third region C that is determined by a current strobe position. The current strobe position may be determined by a triggering edge of the sampling clock signal, or by a level of the sampling clock signal. In another embodiment, sampling regions A and B may be adjacent to each other at the current strobe position. Timer 335 is arranged to provide a clock signal to state machine 336.

Upon completion of counting transitions in each sampling region, a result for each region is provided to comparison block 337. Comparison block 337 is arranged determine a difference between the number of transitions in sampling regions A and B ($T_A-T_B$), as well as a difference between the number of transitions in sampling regions B and A ($T_B-T_A$). Comparison block 337 is further arranged to determine whether ($T_A-T_B$) is larger than a predetermined transition hysteresis threshold constant $K_H$, and whether ($T_B-T_A$) is larger than $K_H$. Comparison block 337 then provides a result of this comparison to state machine 336, which instructs delay lock loop to update the current strobe position. The updated current strobe position allows data deserializer to use the next clock signal to the left (decremented) or to the right (incremented) by a delay tap to resample the data.

The current strobe position may be updated as follows:
if ($T_A-T_B$)>$K_H$, the strobe position is decremented;
if ($T_B-T_A$)>$K_H$, the strobe position is incremented;
if ($T_A-T_B$)<$K_H$ and ($T_B-T_A$)<$K_H$, the strobe position is held.

Once state machine 336 determines a new strobe position for the analyzed bit, it may send out an instruction to move the analysis to another bit. If the analyzed bit is a last bit of a channel, state machine 336 may instruct the algorithm to move to another channel. In one embodiment, the transition hysteresis threshold constant may be zero, where the algorithm works without a hysteresis.

While the deskew algorithm described above may be performed for each bit individually, it may also be implemented in a staggered manner. In one embodiment, deskew process may be performed for a channel based on the above described analysis for a first bit of that channel. The process may then move to another channel. This stage of the deskew process is coarse deskew. Once all channels have been processed by the coarse deskew, the algorithm may begin performing the deskew process on individual bits of each channel. The second stage of the process is fine deskew. Time and processing capacity considerations may allow a state machine to dynamically perform coarse and/or fine deskew based on an amount of skew in the incoming data, an externally provided selection, and the like.

Figure 4:
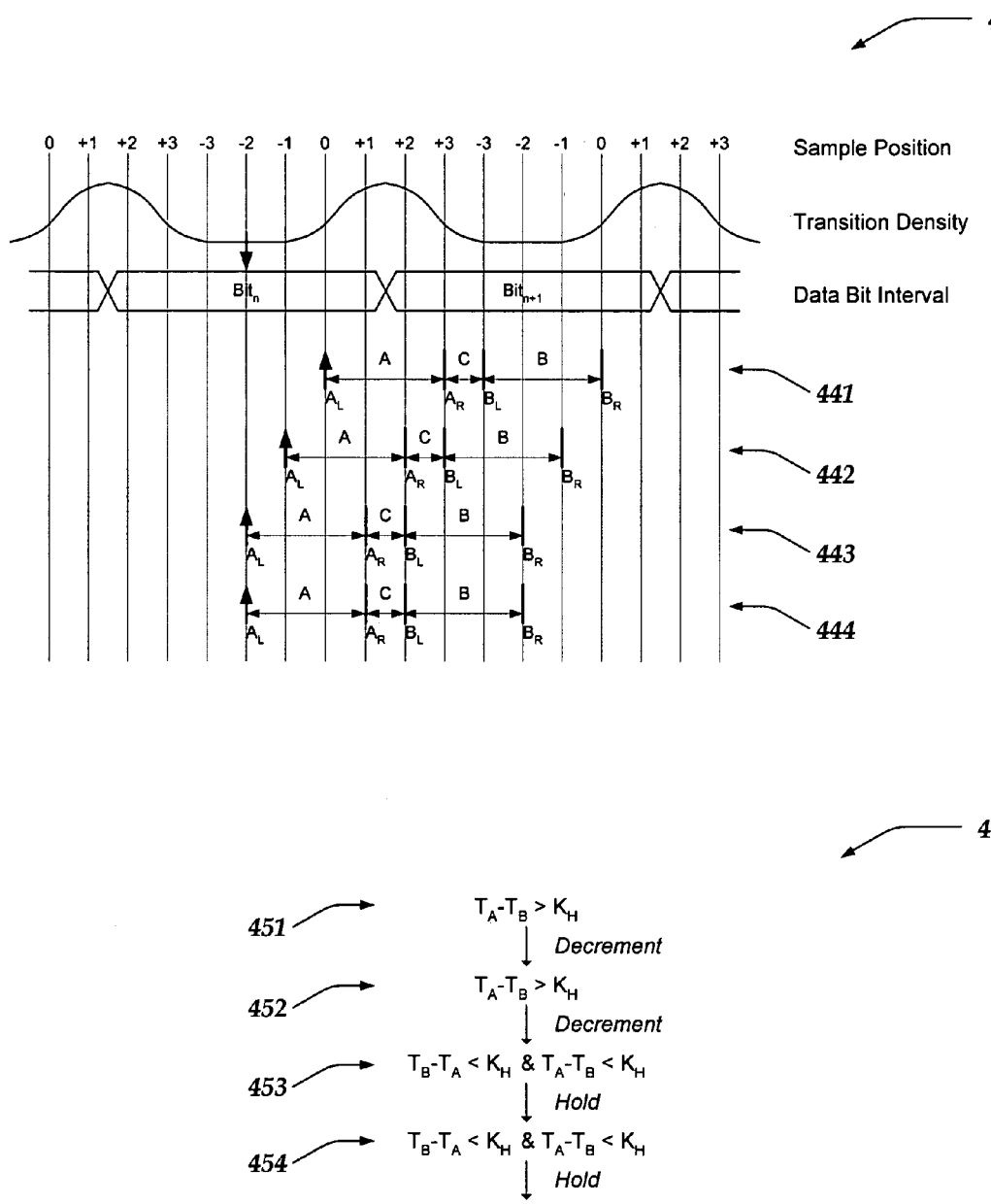
FIG. 4 illustrates a timing diagram and associated steps of the deskew algorithm of FIG. 3 in case of late sampling.

FIG. 4 illustrates timing diagram 400 and associated steps 450 of the deskew algorithm in a case of late sampling. As described before, the algorithm detects when data transitions occur, waits until a predetermined number of transitions have been detected, analyzes the statistics and then increments or decrements a sample strobe position. In a 7-bit system, transition distribution is likely to form a bell curve such as shown in FIG. 4 (transition density). The peaks of the transition density represent maximum transitions for each bit relative to a sample position. Data bit intervals indicate a length of each bit between maximum transition points.

In one embodiment, the algorithm may employ three consecutive sampling regions. First region, A, may be selected three delay taps wide, followed by second region, C, that is one delay tap wide. Finally, third region B follows C, and may be selected three delay taps wide. In another embodiment, the widths of the sampling regions may be selected differently. In a further embodiment, sampling regions A and B may be employed instead of three regions. Start and stop points of sampling regions, such as $A_L$ (A-left), $A_R$ (A-right) overlap with sample positions.

In the case of late sampling, first sampled region is after the transition density peak of the sampled bit. The algorithm begins by counting transitions in sampling regions A and B, then determines number of transitions in each region ($T_A$ and $T_B$). Next, the algorithm determines a difference between the number of transitions ($T_A-T_B$). This is followed by a comparison between ($T_A-T_B$) and a predetermined transition hysteresis threshold constant $K_H$. If ($T_A-T_B$) is larger than $K_H$, the strobe position is decremented and the same analysis repeated.

While, FIG. 4 shows an example of a four step deskew process, the process may be implemented employing virtually any number of steps. The number of steps in the process may be determined by a number of resampling stages in the data deserializer circuit. Once the algorithm determines ($T_A-T_B$)<$K_H$ and ($T_B-T_A$)<$K_H$, the current strobe position is held and forwarded to delay lock loop for modifying deserialization timing signal Deser_clock. Upon determination of the final strobe position for a bit, the algorithm may move to another bit within the same channel or to another bit in another channel.

Figure 5:
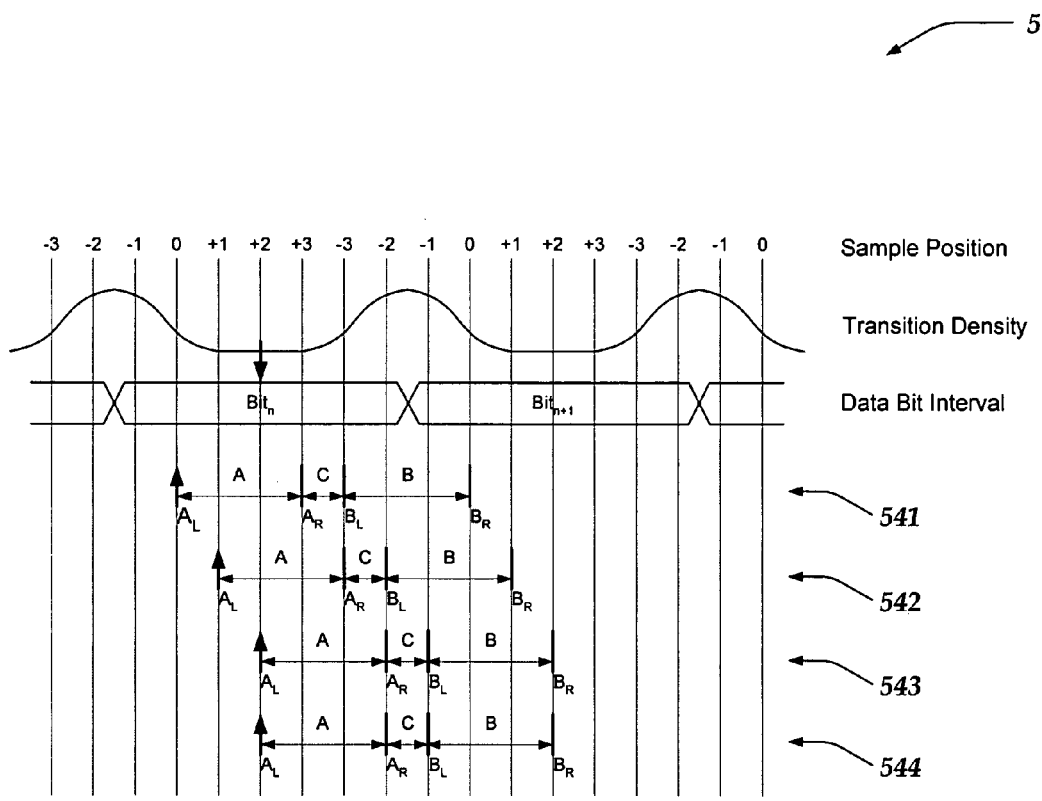
FIG. 5 illustrates a timing diagram and associated steps of the deskew algorithm of FIG. 3 in case of early sampling.
Figure 5:
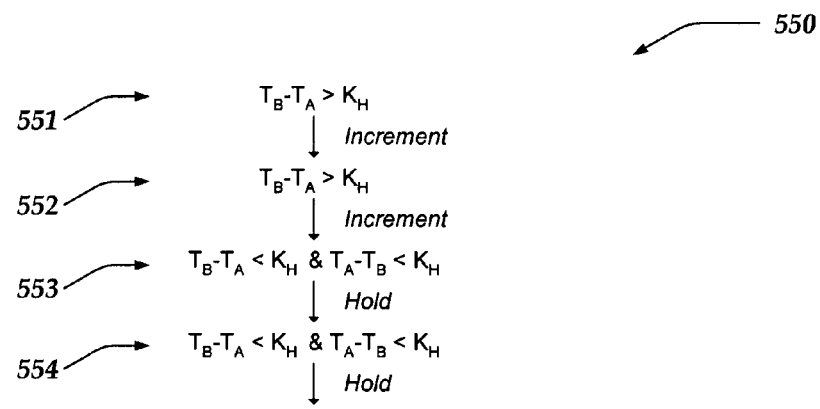

FIG. 5 illustrates timing diagram 500 and associated steps 550 of the deskew algorithm in a case of early sampling. The deskew process in the case of early sampling may be substantially similar to the process in case of late sampling with two differences. First an original strobe position is before the transitions density peak of the deskewed bit.

Another difference between late sampling and early sampling involves the comparison and resulting action in the algorithm. In the case of early sampling, the difference between transitions is computed subtracting $T_A$ from $T_B$, and comparing ($T_B-T_A$) to predetermined transition hysteresis threshold constant $K_H$. If ($T_B-T_A$) is larger than $K_H$, the strobe position is incremented instead of decremented. All other aspects of the deskew process in the case of early sampling may virtually identical to the late sampling deskew process described above in conjunction with FIG. 4.

Figure 6:
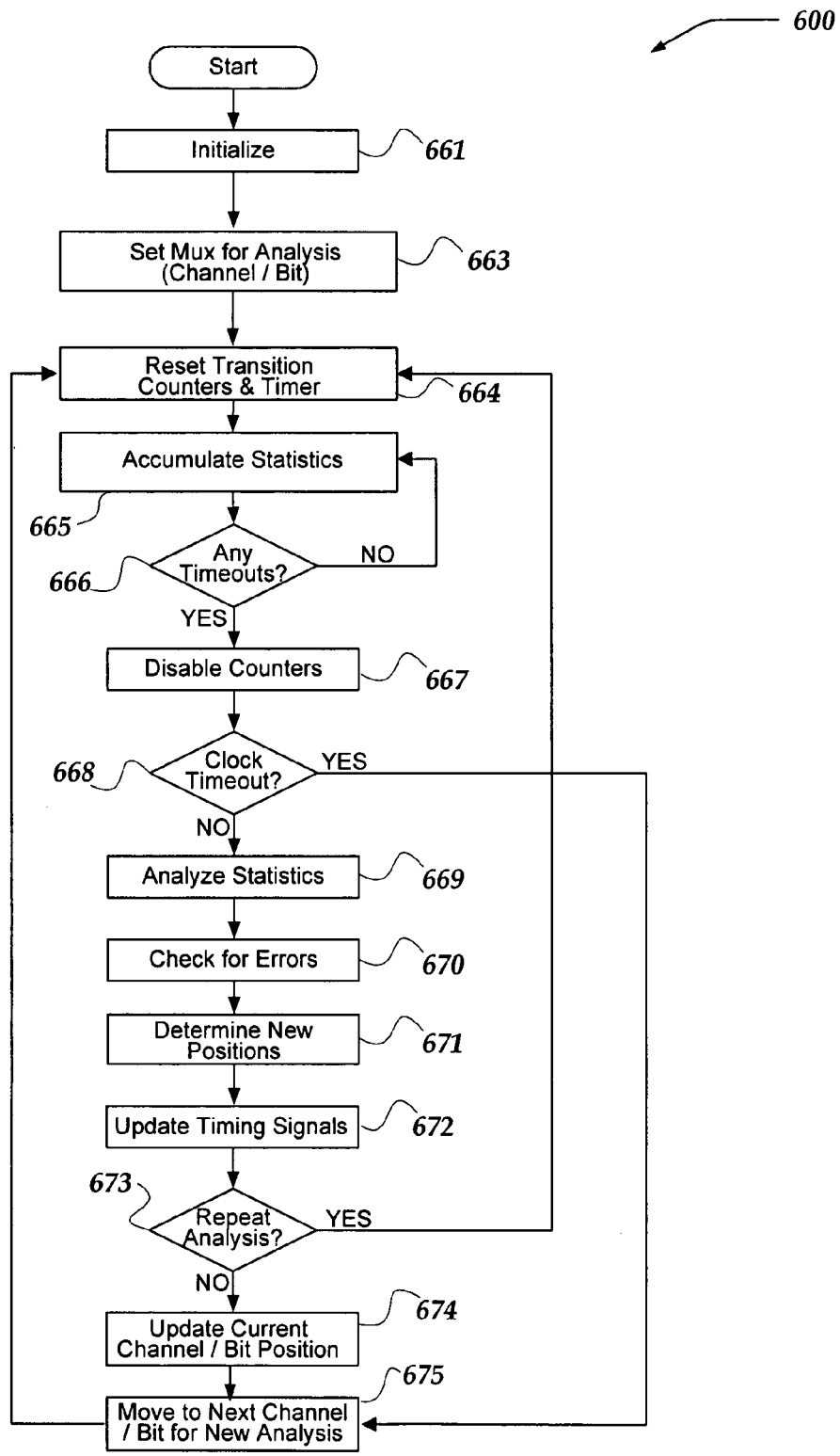
FIG. 6 illustrates a flow diagram of the deskew algorithm of FIG. 3.

FIG. 6 illustrates a flow diagram generally showing deskew process 600. Deskew process 600 may, for example, be implemented in high-speed receiver circuit 100 of FIG. 1.

As shown in the figure, deskew process 600 begins after a start block, at block 661, where the circuit is initialized. Processing then proceeds to block 663, where sampling and deskew multiplexers are set for analysis. As described above, the deskew algorithm may perform analysis and deskew on virtually all individual bits of a channel (fine deskew), perform analysis on one selected bit of each channel and deskew the whole channel based on that analysis (coarse deskew), and perform a combination of coarse and fine deskew. At block 663, multiplexers may be set up for a desired type of deskew.

Processing then proceeds to block 664, where transition counters and timers are reset. This block is followed by block 665, where statistics are accumulated. Accumulation of statistics is essentially counting of transitions in each of the predetermined sampling regions.

Processing then proceeds to decision block 666, where a determination is made as to whether any timeouts occurred or not. If the decision is negative, processing returns to block 665 and continues to accumulate statistics. If the decision is affirmative, processing proceeds to block 667.

At block 667, counters, which are arranged to accumulate number of transitions in the sampling regions, are disabled. Block 667 is followed by decision block 668, where a determination is made as to whether the timeout that occurred was a clock timeout or not. If the decision is affirmative, no transitions have occurred during the predetermined sampling interval. Accordingly, processing proceeds to block 675, where the deskew process moves to another bit or channel for new analysis and deskew. In case of fine deskew, process may move to another bit within the same channel or to a first bit of another channel, if the bit analyzed was the last bit of a channel. In case of coarse deskew, process may move to another channel.

If the decision at block 668 is negative, processing proceeds to block 669, where the statistics are analyzed. The analysis of the statistics is essentially a comparison of a difference between the number of transitions in each sampling region and a predetermined transition hysteresis threshold constant, $K_H$, as described above in detail. Processing then proceeds to block 671.

At block 671, a new strobe position is determined based on a result of the comparison at block 669. The new strobe position shifts the sampling regions by a delay tap to the left or to the right of the original strobe position. If the difference of the number of transitions is less than $K_H$, however, the strobe position may remain the same. Processing then proceeds to block 672, where timing signals are updated based on the new strobe position. As described above deskew block may provide updated timing signal based on the new strobe position to delay lock loop, which in turn may modify a timing signal of data deserializer allowing data being deserialized to be deskewed.

Processing next proceeds to decision block 673, where a determination is made whether the analysis is to be repeated. Based on an external parameter, the deskew process may be repeated as many times as necessary. If the decision at block 673 is affirmative, processing proceeds to block 664 for another round of statistic accumulation, analysis, and deskew. If the decision is negative, processing proceeds to block 674, where current channel and bit positions are updated. Processing then proceeds to block 675, where the deskew process moves to another bit or channel for new analysis and deskew.

The above specification, examples and data provide a description of the manufacture and use of the composition of the invention. Since many embodiments of the invention can be made without departing from the spirit and scope of the invention, the invention also resides in the claims hereinafter appended.

We claim:

1. A method for performing a deskew process on data, comprising:
   selecting a strobe position of a strobe signal;
   determining a first sampling region and a second sampling region based on the strobe position;
   if a predetermined transition hysteresis threshold constant ($K_H$) is smaller than a first difference that is determined by subtracting a number of transitions in the first sampling region from a number of transitions in the second sampling region, decrementing the sampling regions by moving the strobe position to an earlier time point;
   if a predetermined transition hysteresis threshold constant ($K_H$) is smaller than a second difference that is determined by subtracting a number of transitions in the second sampling region from a number of transitions in the first sampling region, incrementing the sampling regions by moving the strobe position to a later time point; and
   if $K_H$ is larger than an absolute value of the difference between the number of transitions in the first sampling region and the number of transitions in the second sampling region, determining a deskew signal based on a current strobe position of the strobe signal.

2. The method of claim 1, further comprising:
   deskewing the data by modifying a timing signal for data sampling based on the deskew signal.

3. The method of claim 1, further comprising:
   deskewing the data by modifying a timing signal for data deserialization based on the deskew signal.

4. The method of claim 1, wherein the first sampling region and the second sampling region are determined such that the first and the second sampling regions are adjacent.

5. The method of claim 3, further comprising:
   performing a coarse deskew on a plurality of channels, wherein the coarse deskew comprises:
      determining the deskew signal for a first bit of each channel sequentially; and
      modifying the timing signal for data deserialization of each channel based, in part, on the deskew signal for the first bit of that channel; and
   performing a fine deskew on the plurality of channels, wherein the fine deskew comprises:
      determining the deskew signal for each bit of each channel sequentially; and
      modifying the timing signal for data deserialization for each bit of each channel based, in part, on the deskew signal for that bit.

6. The method of claim 3, wherein modifying the timing signal for data deserialization comprises:
   shifting each sampling region by a delay tap; and
   resampling the data in the new sampling regions.

7. The method of claim 1, wherein the transition hysteresis threshold constant is predetermined based, in part, on a desired sensitivity of the deskew process.

8. The method of claim 1, wherein a width of the first and the second sampling regions is pre-selected based, in part, on a desired accuracy of the deskew process.

9. A circuit for performing a deskew process on arbitrary data, comprising:
   a sampler that is arranged to sample the data in a first sampling region and in a second sampling region;
   a counter that is arranged to count a number of transitions detected in the first sampling region and a number of transitions detected in the second sampling region;
   a comparator that is arranged to compare a predetermined transition hysteresis threshold constant ($K_H$) to at least one of a first difference and a second difference, wherein:
      the first difference is determined by subtracting the number of transitions in the first sampling region from the number of transitions in the second sampling region; and
      the second difference is determined by subtracting the number of transitions in the second sampling region from the number of transitions in the first sampling region; and a state machine that is arranged to enable counting by the counter and to update a clock signal based on the comparison by the comparator, wherein a deskew signal is determined based on the clock signal.

10. The circuit of claim 9, wherein the state machine determines when the deskew process is to be moved to another bit.

11. The circuit of claim 9, wherein the state machine determines when the deskew process is to be moved to another channel.

12. The circuit of claim 9, wherein:
the sampler is further arranged to determine the first sampling region and the second sampling region based on the clock signal; and
the state machine is further arranged to:
if the first difference is larger than $K_H$, instruct the sampler to decrement the sampling regions by moving clock signal to an earlier time point; and
if the second difference is larger than $K_H$, instruct the sampler to increment the sampling regions by moving clock signal to a later time point.

13. A high-speed receiver circuit, comprising:
a delay lock loop (DLL) that is arranged to generate at least one strobe for sampling received data;
a sampler that is arranged to sample the received data by selecting two of a plurality of sampling regions, wherein the sampling regions are determined based on at least one of a triggering edge and a level of the at least one strobe; and
a deskew circuit that is arranged to perform functions including:
counting a number of transitions in each of the selected sampling regions;
if a difference between the number of transitions in one selected sampling region and the number of transitions in another selected sampling region is larger than a predetermined transition hysteresis threshold constant, moving the strobe by a delay tap;
if the difference between the number of transitions in the adjacent sampling regions is smaller than the predetermined transition hysteresis threshold constant, determining a final strobe; and
providing a deskewed data signal based, in part, on the final strobe.

14. The high-speed receiver circuit of claim 13, further comprising:
a deserializer that is arranged to convert the received high-speed serial data to parallel data.

15. The high-speed receiver circuit of claim 13, further comprising:
a low voltage differential signaling (LVDS) front end that includes a high-speed amplifier; and
a current source that is arranged to operate as a biasing current generator for the LVDS front end and the DLL.

16. The high-speed receiver circuit of claim 13, further comprising:
a first multiplexer that is arranged to provide the sampled data to the deserializer; and
a second multiplexer that is arranged to provide a subset of the sampled data to the deskew circuit.

17. The high-speed receiver circuit of claim 13, wherein the circuit converts four channels of seven bit data to twenty-eight bit parallel data.

18. The high-speed receiver circuit of claim 13, wherein the DLL is further arranged to deskew a received timing signal.

19. The high-speed receiver circuit of claim 13, wherein the transition hysteresis threshold constant is zero.

20. The high-speed receiver circuit of claim 13, wherein the deskew circuit is arranged to deskew at least one of an entire channel and at least one bit within a selected channel.

21. A circuit for performing a deskew process on arbitrary data, comprising:
a means for selecting a strobe position of a strobe signal;
a means for determining a first sampling region and a second sampling region based on the strobe position;
a means for detecting a number of transitions in the first sampling region and a number of transitions in the second sampling region;
a means for decrementing the sampling regions by moving the strobe position to an earlier time point, if a difference between the number of transitions in the first sampling region and the number of transitions in the second sampling region is larger than a predetermined transition hysteresis threshold constant ($K_H$);
a means for incrementing the sampling regions by moving the strobe position to a later time point, if a difference between the number of transitions in the second sampling region and the number of transitions in the first sampling region is larger than $K_H$; and
a means for determining a deskew signal based on a current strobe position of the strobe signal, if an absolute value of the difference between the number of transitions in the first sampling region and the number of transitions in the second sampling region is smaller than $K_H$.

* * * * *